United States Patent
Mietus

(10) Patent No.: US 9,129,680 B2
(45) Date of Patent: *Sep. 8, 2015

(54) SELF-BIASING MULTI-REFERENCE

(71) Applicant: Microchip Technology Incorporated, Chandler, AZ (US)

(72) Inventor: David Francis Mietus, Maricopa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 11 days.

This patent is subject to a terminal disclaimer.

(21) Appl. No.: 14/029,616

(22) Filed: Sep. 17, 2013

(65) Prior Publication Data

US 2014/0078831 A1    Mar. 20, 2014

Related U.S. Application Data

(60) Provisional application No. 61/702,391, filed on Sep. 18, 2012.

(51) Int. Cl.
| | |
|---|---|
| G11C 7/06 | (2006.01) |
| G11C 16/06 | (2006.01) |
| G11C 7/14 | (2006.01) |
| G11C 16/24 | (2006.01) |
| G11C 16/28 | (2006.01) |
| G11C 13/00 | (2006.01) |

(52) U.S. Cl.
CPC ................ G11C 16/06 (2013.01); G11C 7/062 (2013.01); G11C 7/14 (2013.01); G11C 16/24 (2013.01); G11C 16/28 (2013.01); G11C 7/06 (2013.01); G11C 2013/0057 (2013.01)

(58) Field of Classification Search
CPC ............. G11C 7/06; G11C 16/28; G11C 7/14
USPC .............................. 365/185.2, 185.21, 189.15
See application file for complete search history.

(56) References Cited

U.S. PATENT DOCUMENTS

| | | | |
|---|---|---|---|
| 2001/0003507 A1* | 6/2001 | Maruyama et al. ......... | 365/185.2 |
| 2008/0106945 A1 | 5/2008 | Jo et al. .................... | 365/185.21 |

(Continued)

FOREIGN PATENT DOCUMENTS

| | | | | |
|---|---|---|---|---|
| EP | 1420410 A2 | 5/2004 | ............. | G11C 11/16 |

OTHER PUBLICATIONS

International Search Report and Written Opinion, Application No. PCT/US2013/060310, 11 pages, Jan. 24, 2014.

(Continued)

*Primary Examiner* — Shawki S Ismail
*Assistant Examiner* — Muhammad Islam
(74) *Attorney, Agent, or Firm* — Slayden Grubert Beard PLLC

(57) ABSTRACT

Current appearing on a bit-line with no memory cells asserted may be used during a bit-line pre-charge time before a read is performed so as to bias a gate-drain shorted PMOS pull-up device connected between the bit-line and a power supply at a $V_{DD}$ potential. The capacitance connected to the gate of this PMOS pull-up device may be used to "store" the resultant gate-source voltage when the drain is disconnected once the pre-charge time is completed. Once the read operation starts, the current of the PMOS pull-up device that has the "stored" resultant gate-source voltage and the "stored" resultant gate-source voltage itself are re-used as the references, or multi-reference, for sensing the state of an asserted memory cell connected to the bit-line during the read operation thereof.

25 Claims, 5 Drawing Sheets

(56) References Cited

U.S. PATENT DOCUMENTS

2008/0175075 A1* 7/2008 La Rosa ................... 365/189.15
2011/0286259 A1 11/2011 Perner .......................... 365/148

OTHER PUBLICATIONS

International Search Report and Written Opinion, Application No. PCT/US2013/060302, 10 pages, Jan. 24, 2014.

* cited by examiner

SELF-BIASING MULTI-REFERENCE

RELATED PATENT APPLICATION

This application claims priority to commonly owned U.S. Provisional Patent Application Ser. No. 61/702,391; filed Sep. 18, 2012; entitled "Self-Biasing Multi-Reference," by David Francis Mietus, and is hereby incorporated by reference herein for all purposes.

TECHNICAL FIELD

The present disclosure relates to a self-biasing multi-reference, in particular, to a self-biasing multi-reference used in memory cells.

BACKGROUND

Electrically erasable and programmable read only memory (EEPROM) is a rewritable memory device that can hold its memory contents without power. EEPROMs are bit or byte addressable at the write level, which means either the bit or byte must be erased before it can be re-written. EEPROMs are typically used on circuit boards to store instructions and data. Referring to FIG. 1, a "floating gate" holds the stored bit charge in the EEPROM. Complementary metal oxide semiconductor (CMOS) based transistor technologies are generally used and have a "floating gate" to hold the stored bit charge. When no charge is on the floating gate, the transistor acts normally, and a pulse on the control gate causes current to flow. When the floating gate is charged, this charge blocks the normal control gate action of the memory cell transistor, and current does not flow during a pulse on the control gate. Charging is accomplished by grounding the source and drain terminals and placing sufficient voltage on the control gate so that the charge tunnels through the oxide to the floating gate. A reverse voltage channeled from another transistor clears the floating gate charge by causing it to dissipate into the integrated circuit substrate.

Memory devices require high reliability. Technologies used to create for example, serial EEPROM products can have limitations in the devices ability to read proper data out of the memory array. For example, excess "cell" leakage can minimize/eliminate the ability to distinguish between the "on" cell and "off" cell currents of an asserted memory cell being read. An offset can be caused by use of "leaker" transistor connected to bit-line. Use of self-timed read scheme may allow for bit-line discharge before a read. Use of a read charge pump may minimize supply variations of "on" cell current.

Furthermore, the degradation of "on" cell current and/or uncontrolled/incorrect reference current levels limit sense amplifier performance. There is endurance related degradation of "on" cell current. Reference voltage/current levels used may vary excessively with the process used and/or does not track "on" cell current versus voltage supply and/or temperature. Bit-line leakage current cannot be compensated for by a fixed reference current.

SUMMARY

Therefore, a need exists in EEPROM memory products for improved immunity to endurance degradation of memory cell current; eliminating external reference current and/or leakage compensation, improving circuit function by minimizing effects of leakage current at high temperatures, and enabling lower power operation by not requiring a bit-line to be pre-charged to the full $V_{DD}$ potential during read operations.

According to an embodiment, a method for determining a charge state of a memory cell having a floating gate may comprise the steps of: sensing a first current in a bit-line when all memory cells coupled to the bit-line may be de-asserted; converting the first current to a voltage; storing the voltage; providing a reference current based upon the stored voltage; providing a voltage reference used as an input for a sense amplifier from the stored voltage; comparing the reference current to a second current in the bit-line with the sense amplifier when a single memory cell connected to the bit-line may be asserted during a read operation thereof; and determining from the sense amplifier output a bit value charge state stored in the single memory cell from the comparison of the reference current with the second current.

According to a further embodiment of the method, the step of sensing the first current may comprise the step of coupling a gate and drain of a first transistor to the bit-line when all memory cells coupled to the bit-line may be de-asserted. According to a further embodiment of the method, the step of converting the first current to the voltage may comprise the step of generating the voltage across the gate and a source of the first transistor from the sensed first current. According to a further embodiment of the method, the step of storing the voltage may comprise the step of coupling the voltage across a gate and a connected together source-drain of a second transistor, wherein the voltage may be stored between a capacitance formed between a gate and source-drain of the second transistor. According to a further embodiment of the method, the step of storing the voltage may comprise the step of coupling the voltage across a capacitor.

According to a further embodiment of the method, the step of providing the reference current may comprise the step of generating the reference current with the first transistor based upon the voltage stored in the second transistor. According to a further embodiment of the method, the step of providing the reference current may comprise the step of generating the reference current with the first transistor base upon the voltage stored in the capacitor. According to a further embodiment of the method, the step of comparing the reference current with the second current may comprise the step of monitoring the voltage of the bit-line associated with the memory cell after said memory cell has been asserted. According to a further embodiment of the method, the step of determining the bit value charge state stored in the single memory cell may comprise step of detecting the change in logic state or lack thereof of the bit-line associated with the asserted memory cell.

According to a further embodiment of the method, the drain of the first transistor may be coupled to the bit-line and the source of the first transistor may be coupled to a power supply voltage, and the voltage stored in the second transistor biases the first transistor to provide the reference current. According to a further embodiment of the method, during a read operation of the asserted memory cell the stored voltage in the second transistor may be used in determining the reference current for sensing the bit value charge state of the asserted memory cell coupled to the bit-line. According to a further embodiment of the method, during a read operation of the asserted memory cell the stored voltage in the second transistor may be re-used as the reference input to the sense amplifier having an output that determines the bit value charge state of the asserted memory cell coupled to the bit-line. According to a further embodiment of the method, the first and second transistors may be p-type metal oxide semi-conductor (PMOS) transistors. According to a further embodiment of the method, the first and second transistors may be n-type metal oxide semiconductor (NMOS) transistors.

According to another embodiment, an apparatus for determining a charge state of a memory cell having a floating gate may comprise: a first transistor having a gate and drain coupled to a bit-line and a source coupled to a power supply voltage when all memory cells coupled to the bit-line may be de-asserted, wherein a first current in the bit-line may be sensed; the first transistor converts the first current to a voltage; a second transistor stores the voltage; the first transistor provides a reference current based upon the stored voltage from the second transistor; wherein the stored voltage from the capacitor may be also used as a reference input of a sense amplifier; wherein the reference current may be compared with a second current in the bit-line with the sense amplifier when a single memory cell connected to the bit-line may be asserted during a read operation thereof; and a bit value charge state stored in the single memory cell may be determined from the sense amplifier comparing the reference current with the second current.

According to a further embodiment, the first current through the first transistor generates the voltage between the gate and a source of the first transistor. According to a further embodiment, the voltage may be stored between a capacitance formed between a gate and source-drain of the second transistor. According to a further embodiment, the voltage may be stored on a capacitor. According to a further embodiment, the reference current may be compared with the second current by means of the bit-line associated with the asserted memory cell. According to a further embodiment, the bit value charge state stored in the single memory cell may be determined by detecting the change in logic state or lack thereof of the bit-line associated with the asserted memory cell. According to a further embodiment, the drain of the first transistor may be coupled to the bit-line, the source of the first transistor may be coupled to a power supply voltage, and the voltage stored in the second transistor biases the first transistor to provide the reference current. According to a further embodiment, during a read operation of the asserted memory cell the stored voltage in the second transistor may be provided as the reference input to a sense amplifier whose output means determines the bit value charge state of the asserted memory cell coupled to the bit-line. According to a further embodiment, the first and second transistors may be p-type metal oxide semiconductor (PMOS) transistors. According to a further embodiment, the first and second transistors may be n-type metal oxide semiconductor (NMOS) transistors.

According to yet another embodiment, an apparatus for determining a charge state of a memory cell having a floating gate may comprise: a first transistor having a gate and drain coupled to a bit-line and a source coupled to a power supply voltage when all memory cells coupled to the bit-line may be de-asserted, wherein a first current in the bit-line may be sensed; the first transistor converts the first current to a voltage; a capacitor stores the voltage; the first transistor provides a reference current based upon the stored voltage from the capacitor; the stored voltage from the capacitor may be provided as a reference input of a sense amplifier; wherein the reference current may be compared with a second current in the bit-line with the sense amplifier when a single memory cell connected to the bit-line may be asserted during a read operation thereof; and a bit value charge state stored in the single memory cell may be determined from the sense amplifier comparing the reference current with the second current.

BRIEF DESCRIPTION OF THE DRAWINGS

A more complete understanding of the present disclosure may be acquired by referring to the following description taken in conjunction with the accompanying drawings wherein.

Figure 1:
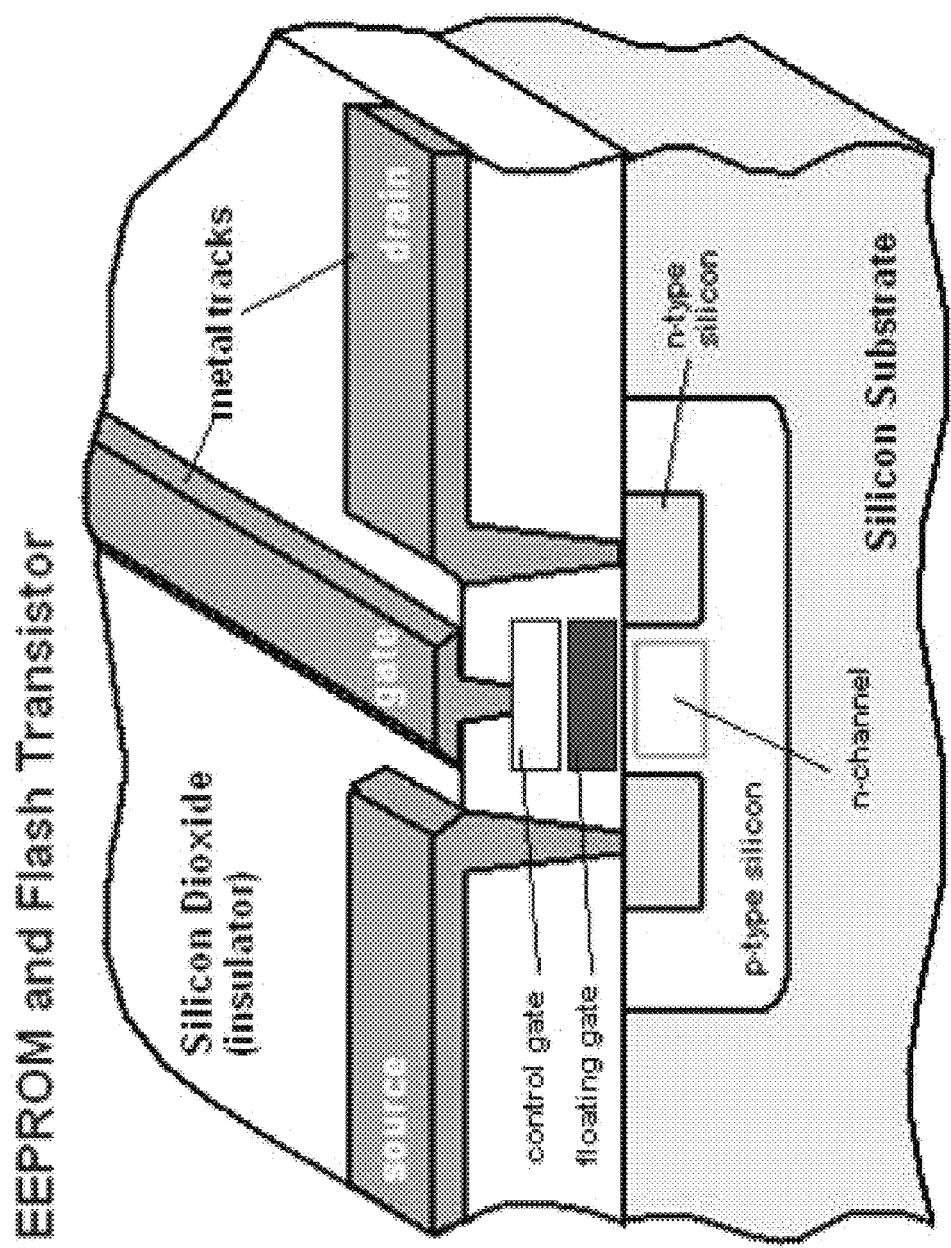
FIG. 1 illustrates a schematic cross-section diagram of an electrically erasable and programmable read only memory (EEPROM) transistor, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments of this disclosure, the current present on an unasserted memory array bit-line may be sensed and stored as a voltage. This stored voltage may then be utilized to generate a reference current and as a reference voltage for a sense amplifier when determining the state of an asserted memory cell during a read operation thereof. Furthermore, according to various embodiments, an improved circuit function may be provided by minimizing the effects of leakage current at high temperatures. Various embodiments enable lower power operation since the bit-line may be precharged to less than a $V_{DD}$ potential during reads of the asserted memory cell.

According to various embodiments, the immunity to endurance degradation of memory cell current is improved and the need for external reference voltage, current and/or leakage compensation may be eliminated.

According to various embodiments, the current appearing on the bit-line with no memory cells asserted may be used during the bit-line pre-charge time before a read is performed to bias the gate-drain shorted PMOS pull-up device connected between the bit-line and the supply at a $V_{DD}$ potential. The capacitance connected to the gate of this PMOS pull-up device may be used to "store" the resultant gate-source voltage when the drain is disconnected once the pre-charge time is completed. Once the read operation starts, the current of the PMOS pull-up device that has the "stored" resultant gate-source voltage is re-used as the reference for sensing the state of an asserted memory cell connected to the bit-line while the sense amplifier uses the "stored" voltage as a reference for comparison against the resultant bit-line voltage in order to ascertain the desired output state during the read operation thereof.

Referring now to the drawing, the details of a specific example embodiment is schematically illustrated. Like elements in the drawings will be represented by like numbers, and similar elements will be represented by like numbers with a different lower case letter suffix.

Figure 2:
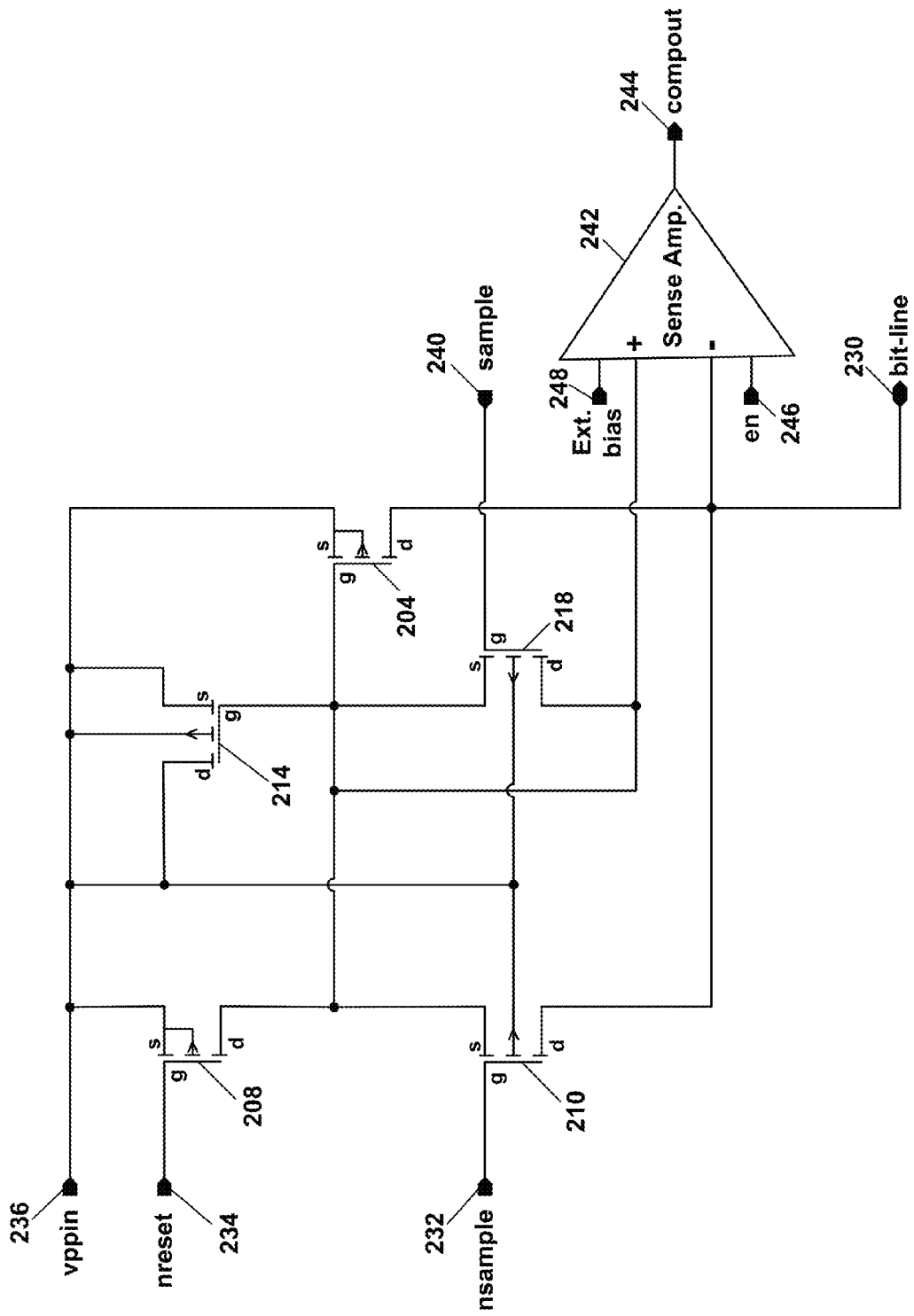
FIG. 2 illustrates a schematic diagram of a self-biasing multi-reference having a sense amplifier, according to a specific example embodiment of this disclosure.

Referring to FIG. 2, depicted is a schematic diagram of a self-biasing multi-reference having a sense amplifier, according to a specific example embodiment of this disclosure. Transistors 204, 208, 210, 214 and 218 may be P-type metal oxide semiconductor (PMOS) transistors arranged and connected together as shown in FIG. 2 and function together as follows: When all of the memory cells of an EEPROM memory array (not shown) attached to a bit-line 230 are de-asserted, current on the bit-line 230 is sensed by asserting a logic low ("0") on the nsample node 232 causing the gate and drain of transistor 204 to be coupled together via transistor 210. Current then flows through transistor 204, thereby generating a voltage that appears across the gate-source of transistor 214 which also functions as a "hold" capacitor for this voltage. It is contemplated and within the scope of this disclosure that N-type metal oxide semiconductor (NMOS) transistors may be used instead of the PMOS transistors, and one having ordinary skill in semiconductor and memory circuit design, and having the benefit of this disclosure, could design such a circuit using NMOS transistors.

When the nsample node 232 is de-asserted to a logic high ("1"), transistor 204 now acts as a current reference, wherein a reference current is determined by the voltage stored across the gate-source of transistor 214 acting as the "hold" capacitor. This reference current may then be compare against a current from a single asserted memory cell (not shown) connected to the bit-line node 230 during a read operation thereof. Depending upon the current from this asserted memory cell, the voltage appearing on the bit-line node 230 may be observed to change its logic state based on the ON (high current) or OFF (low current) state of this asserted memory cell, e.g., bit-line node 230 at a first voltage level when the reference current is greater than the asserted memory cell current and at a second voltage level when the reference current is less than the asserted memory cell current. Sense amplifier 242 is used to detect the voltage level of the bit-line node 230 by re-using the voltage that appears on the gate terminal of transistor 204 as its reference input. Sense amplifier 242 utilizes an external bias, represented by the Ext. bias node 248, and an external state control, represented by the en node 246, which when asserted to a logic high is used to enable sense amplifier 242 for the read operation and when de-asserted disables sense amplifier 242. The compout node 244 is the output of sense amplifier 242 and is the means of monitoring the results of the voltage comparison between bit-line node 230 and the voltage that appears on the gate terminal of transistor 204. The voltage that appears on the gate terminal of transistor 204 serves as a multi-reference since it is used as both the reference for the voltage comparison operation and as the stored voltage bias used in generating the reference utilized for the bit-line current comparison operation. This operation is independent of the number of memory cells connected to the bit-line node 230 since the change in current that is observed is caused by the state change of the single memory cell that is being asserted, as explained more fully hereinafter.

When the nreset node 234 is asserted to a logic low, the transistor 208 may be used to discharge the gate terminal of transistor 204 to the $V_{DD}$ potential present on the vppin node 236 during power cycling or to begin/end a read operation. Transistor 218, along with the sample signal on node 240, may be used as charge compensation to offset the "hold" step voltage that results from de-asserting transistor 210. This may be needed to insure that the reference current generated by transistor 204 is equal to or greater than the current that was originally present on the memory array bit-line node 230. Note that the "hold" capacitor comprising the gate-source of transistor 214 may alternatively be provided by using an actual capacitor, according to a specific example embodiment of this disclosure. Control signals on the Ext. bias node 248 and the en node 246 are used to bias and enable the sense amplifier 242, respectively.

Figure 3:
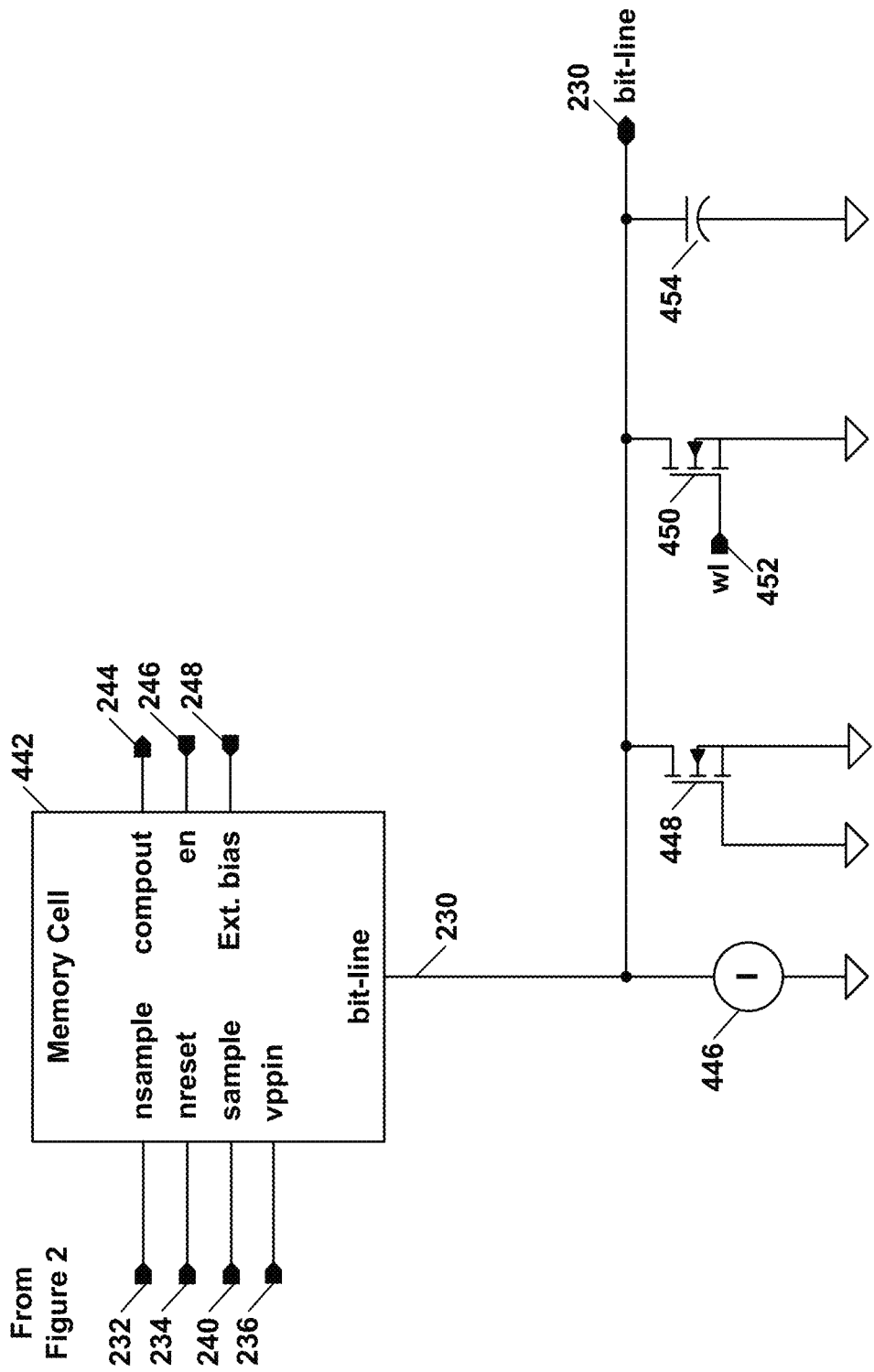
FIG. 3 illustrates a schematic diagram used to model the self-biasing multi-reference shown in FIG. 2.

Referring to FIG. 3, depicted is a schematic diagram used to model the circuit which utilizes the self-biasing multi-reference shown in FIG. 2. Current source 446 is used to include the leakage current generated by other circuit blocks (not shown) that connect to the bit-line node 230. Transistor 448 is used to include the plethora of de-asserted memory cells connected to the bit-line node 230. Transistor 450 represents the single memory cell connected to the bit-line node 230 that is asserted, by means of wl node 452, for the read operation. Capacitor 454 is used to include the parasitic capacitance associated with the bit-line node 230.

Figure 4:
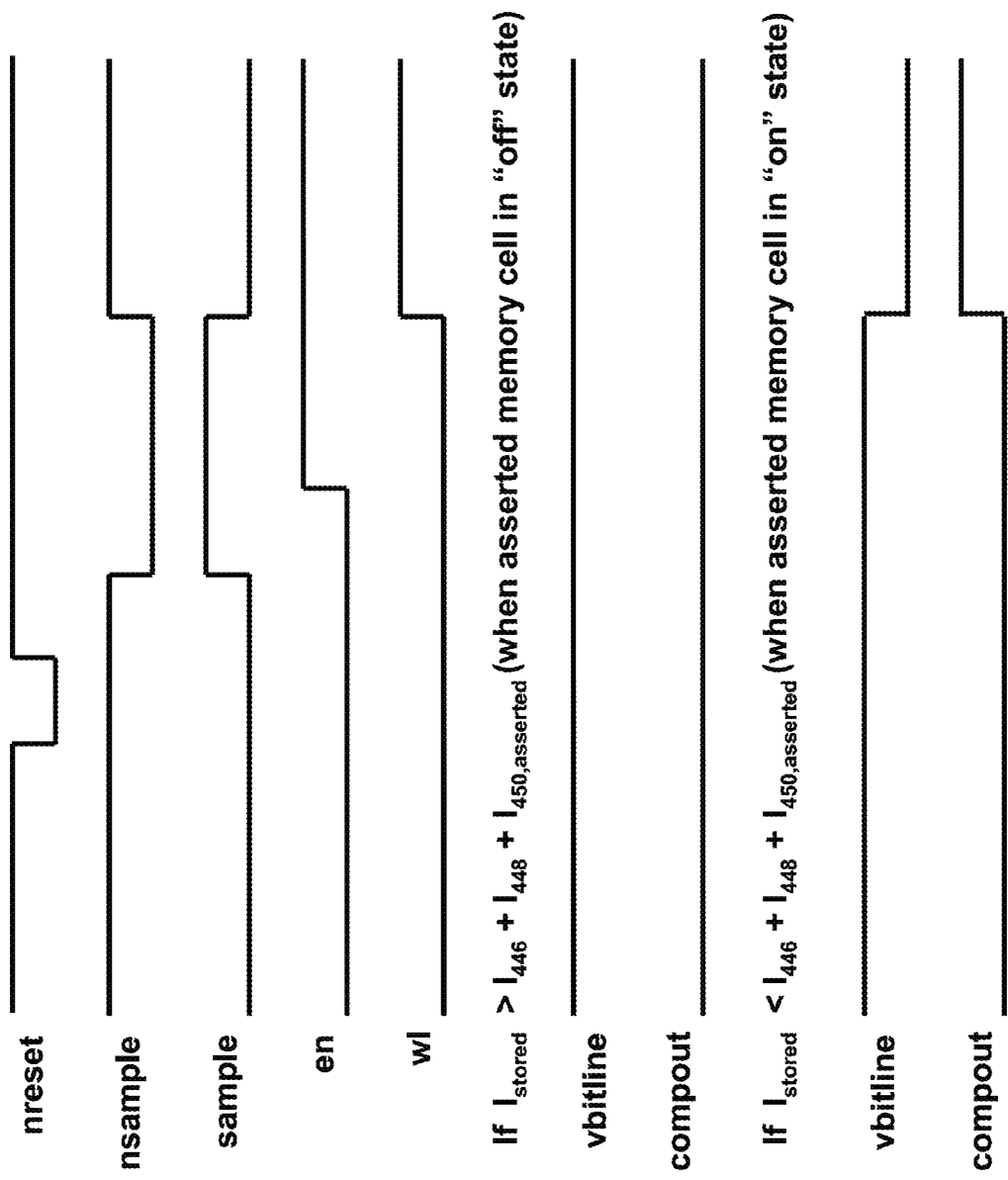
FIG. 4 illustrates read operation timing waveforms associated with the circuit model shown in FIG. 3 for both the "on" and "off" states of the asserted memory cell.

Referring to FIG. 4, depicted are read operation timing waveforms associated with the circuit model shown in FIG. 3 for both the "on" and "off" states of the asserted memory cell. The read operation begins when the nreset node 234 is briefly asserted to a logic low which discharges the gate terminal of transistor 204 to the $V_{DD}$ potential present on the vppin node 236. This also serves to discharge any stored charge present on the gate terminal of transistor 214. The read operation continues by cycling nsample node 232 and sample node 240 which results in the current $I_{store}$ being generated by transistor 204 as determined by the stored charge present on the gate terminal of transistor 214. The value of $I_{store}$ can be approximated as:

$$I_{store} \sim I_{446} + I_{448} + I_{450,de-asserted}$$

This also results in the bit-line node 230 being forced to a voltage that is below the $V_{DD}$ potential present on the vppin node 236 as determined by the gate-source voltage present on transistor 204. Once the cycling of nsample node 232 and sample node 240 has completed, the wl node 452 is transitioned which asserts memory cell transistor 450. With memory cell transistor 450 asserted, the bit-line node 230 will now respond in one of two ways:

1) If memory cell transistor 450 is in an "off" state, then bit-line node 230 will remain unchanged (near Vdd potential) based on the fact that:

$$I_{store} > I_{446} + I_{448} + I_{450,asserted}$$

As a consequence, when bit-line node 230 is compared to the reference voltage that appears on the gate terminal of transistor 204, the output of sense amplifier 242, namely compout node 244, will be in a logic low state.

2) If memory cell transistor 450 is in an "on" state, then bit-line node 230 will be discharged (e.g., near Ground potential) based on the fact that:

$$I_{store} < I_{446} + I_{448} + I_{450,asserted}$$

As a consequence, when bit-line node 230 is compared to the reference voltage that appears on the gate terminal of transistor 204, the output of sense amplifier 242, namely compout node 244, will be in a logic high state.

Therefore, the "on" or "off" state of the memory cell transistor 450 can be readily determined by monitoring the output of sense amplifier 242, namely compout node 244. The read operation is terminated when memory cell transistor 450 is de-asserted by transitioning wl node 452 and disabling sense amplifier 242 by de-asserting the en node 246 (not shown in FIG. 4).

Figure 5:
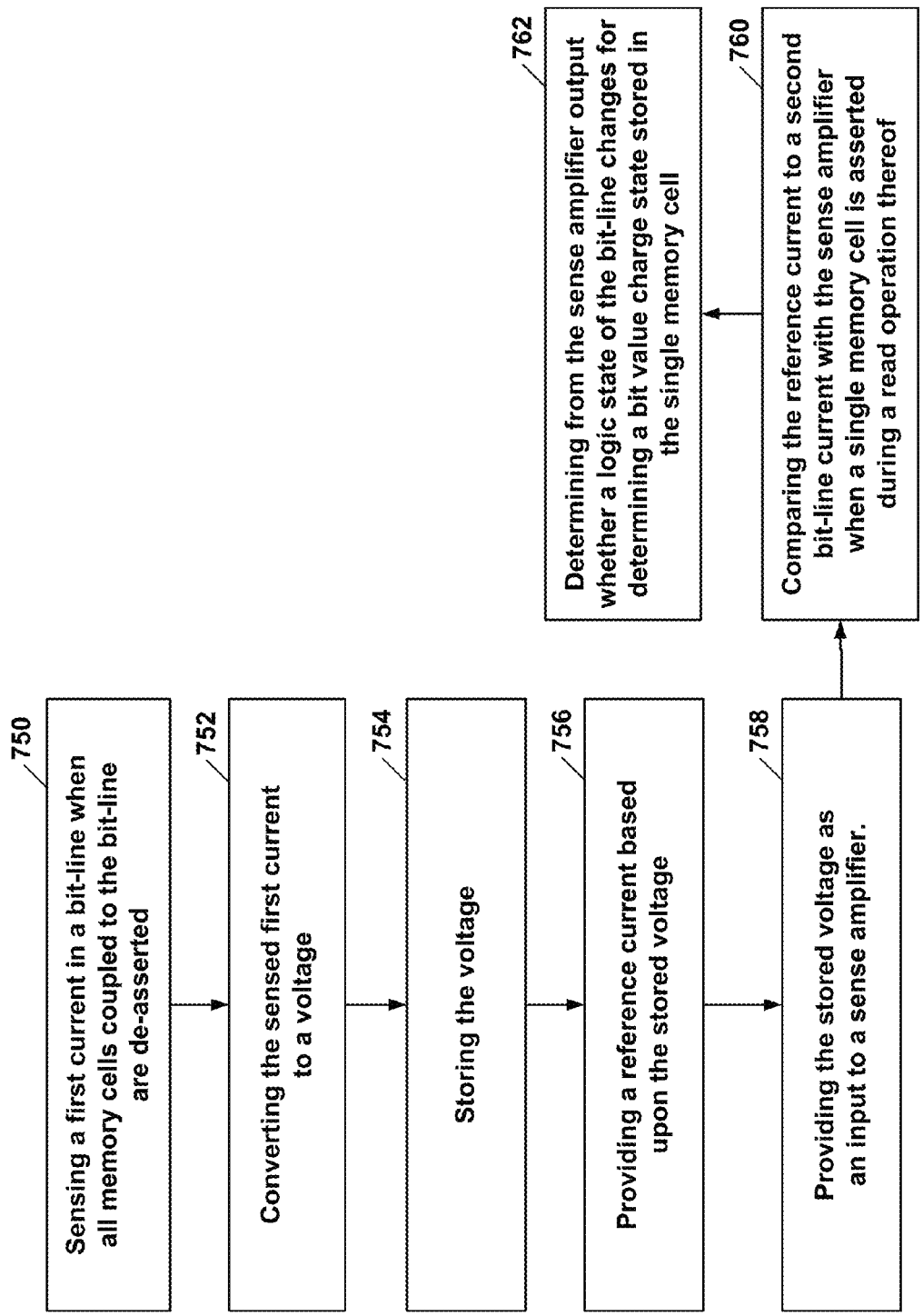
FIG. 5 illustrates a flow diagram associated with the circuit which utilizes the self-biasing multi-reference, according to a specific example embodiment of this disclosure.

Referring to FIG. 5, depicted is a flow diagram associated with the circuit which utilizes the self-biasing multi-reference, according to a specific example embodiment of this disclosure. In step 750 a first bit-line current is sensed when all memory cells coupled to the bit-line are de-asserted. In step 752 the sensed first bit-line current is converted to a voltage, and in step 754 the voltage is stored, e.g., in the gate-source junction of transistor 214 acting as a voltage storage capacitor. In step 756 a reference current is provided based upon the stored voltage. In step 758 the stored voltage is used as a reference for the sense amplifier. In step 760 the reference current is compared to a second bit-line current with a sense amplifier utilizing the reference voltage when a single memory cell coupled thereto is asserted during a read operation. In step 762 a determination is made from the sense amplifier output whether a logic state of the bit-line changes for determining a bit value charge state stored in the single memory cell.

According to the teachings of this disclosure, a "self-biased" multi-reference may be generated that effectively eliminates the limitations of existing solutions for properly reading data out of an EEPROM array. Use of pre-charge voltage less than the supply voltage reduces power consumption. The various embodiments of this disclosure may be used to reduce fabrication costs and enable more robust memory devices such as, for example but not limited to, serial EEPROM products.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for determining a charge state of a memory cell having a floating gate, said method comprising the steps of:
   sensing a first current in a bit-line when all memory cells coupled to the bit-line are de-asserted;
   converting the first current to a voltage;
   storing the voltage;
   providing a reference current based upon the stored voltage;
   providing a voltage reference used as an input for a sense amplifier from the stored voltage;
   comparing the reference current to a second current in the bit-line with the sense amplifier when a single memory cell connected to the bit-line is asserted during a read operation thereof; and
   determining from the sense amplifier output a bit value charge state stored in the single memory cell from the comparison of the reference current with the second current.

2. The method according to claim 1, wherein the step of sensing the first current comprises the step of coupling a gate and drain of a first transistor to the bit-line when all memory cells coupled to the bit-line are de-asserted.

3. The method according to claim 2, wherein the step of converting the first current to the voltage comprises the step of generating the voltage across the gate and a source of the first transistor from the sensed first current.

4. The method according to claim 3, wherein the step of storing the voltage comprises the step of coupling the voltage across a gate and a connected together source-drain of a second transistor, wherein the voltage is stored between a capacitance formed between a gate and source-drain of the second transistor.

5. The method according to claim 3, wherein the step of storing the voltage comprises the step of coupling the voltage across a capacitor.

6. The method according to claim 4, wherein the step of providing the reference current comprises the step of generating the reference current with the first transistor based upon the voltage stored in the second transistor.

7. The method according to claim 5, wherein the step of providing the reference current comprises the step of generating the reference current with the first transistor base upon the voltage stored in the capacitor.

8. The method according to claim 1, wherein the step of comparing the reference current with, the second current comprises the step of monitoring the voltage of the bit-line associated with the memory cell after said memory cell has been asserted.

9. The method according to claim 1, wherein the step of determining the bit value charge state stored in the single memory cell comprises step of detecting the change in logic state or lack thereof of the bit-line associated with the asserted memory cell.

10. The method according to claim 6, wherein the drain of the first transistor is coupled to the bit-line and the source of the first transistor is coupled to a power supply voltage, and the voltage stored in the second transistor biases the first transistor to provide the reference current.

11. The method according to claim 1, wherein during a read operation of the asserted memory cell the stored voltage in the second transistor is used in determining the reference current for sensing the bit value charge state of the asserted memory cell coupled to the bit-line.

12. The method according to claim 1, wherein during a read operation of the asserted memory cell the stored voltage in the second transistor is re-used as the reference input to the sense amplifier having an output that determines the bit value charge state of the asserted memory cell coupled to the bit-line.

13. The method according to claim 4, wherein the first and second transistors are p-type metal oxide semiconductor (PMOS) transistors.

14. The method according to claim 4, wherein the first and second transistors are n-type metal oxide semiconductor (NMOS) transistors.

15. An apparatus for determining a charge state of a memory cell having a floating gate, comprising:
   a first transistor having a gate and drain coupled to a bit-line and a source coupled to a power supply voltage when all memory cells coupled to the bit-line are de-asserted, wherein a first current in the bit-line is sensed;
   the first transistor converts the first current to a voltage;
   a second transistor stores the voltage;
   the first transistor provides a reference current based upon the stored voltage from the second transistor;
   wherein the stored voltage from the capacitor is also used as a reference input of a sense amplifier;
   wherein the reference current is compared with a second current in the bit-line with the sense amplifier when a single memory cell connected to the bit-line is asserted during a read operation thereof; and a bit value charge state stored in the single memory cell is determined from the sense amplifier comparing the reference current with the second current.

16. The apparatus according to claim 15, wherein the first current through the first transistor generates the voltage between the gate and a source of the first transistor.

17. The apparatus according to claim 15, wherein the voltage is stored between a capacitance formed between a gate and source-drain of the second transistor.

18. The apparatus according to claim 15, wherein the voltage is stored on a capacitor.

19. The apparatus according to claim 15, wherein the reference current is compared with the second current by means of the bit-line associated with the asserted memory cell.

20. The apparatus according to claim 15, wherein the bit value charge state stored in the single memory cell is determined by detecting the change in logic state or lack thereof of the bit-line associated with the asserted memory cell.

21. The apparatus according to claim 15, wherein the drain of the first transistor is coupled to the bit-line, the source of the first transistor is coupled to a power supply voltage, and the voltage stored in the second transistor biases the first transistor to provide the reference current.

22. The apparatus according to claim 15, wherein during a read operation of the asserted memory cell the stored voltage in the second transistor is provided as the reference input to a sense amplifier whose output means determines the bit value charge state of the asserted memory cell coupled to the bit-line.

23. The apparatus according to claim 15, wherein the first and second transistors are p-type metal oxide semiconductor (PMOS) transistors.

24. The apparatus according to claim 15, wherein the first and second transistors are n-type metal oxide semiconductor (NMOS) transistors.

25. An apparatus for determining a charge state of a memory cell having a floating gate, comprising:
a first transistor having a gate and drain coupled to a bit-line and a source coupled to a power supply voltage when all memory cells coupled to the bit-line are de-asserted, wherein a first current in the bit-line is sensed;
the first transistor converts the first current to a voltage;
a capacitor stores the voltage;
the first transistor provides a reference current based upon the stored voltage from the capacitor;
the stored voltage from the capacitor is provided as a reference input of a sense amplifier;
wherein the reference current is compared with a second current in the bit-line with the sense amplifier when a single memory cell connected to the bit-line is asserted during a read operation thereof; and
a bit value charge state stored in the single memory cell is determined from the sense amplifier comparing the reference current with the second current.

* * * * *